US008556298B2

(12) United States Patent
Lesur

(10) Patent No.: US 8,556,298 B2
(45) Date of Patent: Oct. 15, 2013

(54) PERSONALISABLE SUPPORT INCLUDING ANTI-FORGERY DEVICE AND FABRICATION PROCESS OF SUCH SUPPORTS

(75) Inventor: Jean-Luc Lesur, Bras (FR)

(73) Assignee: Gemalto SA, Meudon (FR)

( * ) Notice: Subject to any disclaimer, the term of this patent is extended or adjusted under 35 U.S.C. 154(b) by 112 days.

(21) Appl. No.: 12/937,796

(22) PCT Filed: Apr. 14, 2009

(86) PCT No.: PCT/EP2009/054404

§ 371 (c)(1), (2), (4) Date: Oct. 14, 2010

(87) PCT Pub. No.: WO2009/127622

PCT Pub. Date: Oct. 22, 2009

(65) Prior Publication Data

US 2011/0033676 A1 Feb. 10, 2011

(30) Foreign Application Priority Data

Apr. 15, 2008 (EP) .................................... 08290369

(51) Int. Cl.

| | |
|---|---|
| ***B42D 15/10*** | (2006.01) |
| ***B23K 26/00*** | (2006.01) |
| ***G03F 7/00*** | (2006.01) |
| ***B32B 7/14*** | (2006.01) |
| ***B32B 3/00*** | (2006.01) |

(52) U.S. Cl.
USPC ........ 283/72; 428/199; 428/203; 219/121.69; 430/270.1

(58) Field of Classification Search
USPC .................. 430/270.1; 428/199, 203; 283/72; 219/121.69
See application file for complete search history.

(56) References Cited

U.S. PATENT DOCUMENTS

| | | | | |
|---|---|---|---|---|
| 5,977,514 | A * | 11/1999 | Feng et al. | 219/121.69 |
| 6,207,344 | B1 * | 3/2001 | Ramlow et al. | 430/270.1 |
| 2005/0253375 | A1 * | 11/2005 | Lesur | 283/98 |
| 2006/0029760 | A1 | 2/2006 | Kreft et al. | |

FOREIGN PATENT DOCUMENTS

| | | | |
|---|---|---|---|
| EP | 0680831 A | | 11/1995 |
| WO | WO 2004016445 A2 | * | 2/2004 |
| WO | WO2007118654 A | | 10/2007 |

OTHER PUBLICATIONS

PCT/EP2009/054404 International Search Report. Jun. 29, 2009 European Patent Office, P.B.5818 Patentlaan 2 NL-2280 HV Rijswijk. Whole document.

PCT/EP2009/054404 Written Opinion of the International Searching Authority. Jun. 29, 2009 European Patent Office D-80298 Munich. Whole document.

* cited by examiner

*Primary Examiner* — Mark Ruthkosky
*Assistant Examiner* — Laura C Dettinger
(74) *Attorney, Agent, or Firm* — The Jansson Firm; Pehr B. Jansson

(57) ABSTRACT

The invention relates to a personalisable support comprising anti-forgery devices which are provided in order to indicate every attempt of fraudulent personalization. The support comprises a body (2) which is on one side equipped with personalization data (6,7) which are obtained by carbonization of the base material by means of a laser beam. The anti-forgery devices (8), which totally or partly cover these personalization data, draw a pattern (90, 80) along which bubbles (9) are created whose density (d1-d5) varies depending on the degree of carbonization of the areas (61-65) which are covered by the pattern.

8 Claims, 3 Drawing Sheets

PERSONALISABLE SUPPORT INCLUDING ANTI-FORGERY DEVICE AND FABRICATION PROCESS OF SUCH SUPPORTS

This invention concerns a personalisable support including anti-forgery devices provided for indicating any fraudulent personalisation attempt and the fabrication process of such supports.

The invention is for the field of identification documents with or without memory chip, such as driving licenses, identity cards, membership cards, access badges, passports, bank cards, virtual purses, multi-application cards and other valuable documents. Based on the value and importance connected to each of these documents, they are often the subject of unauthorised copies, alterations, modifications and falsifications.

The invention aims to secure personalisation data registered on the support by preventing any subsequent fraudulent modification of this data.

Figure 1:
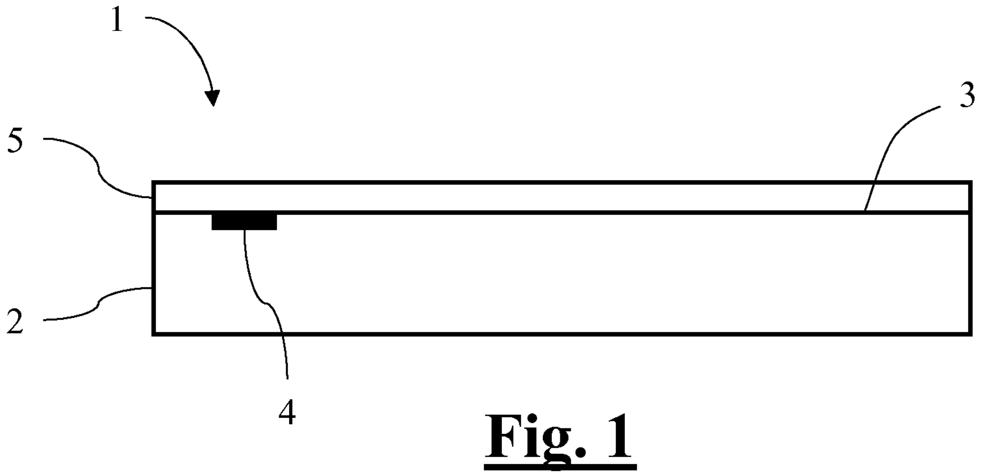
Figure 2:
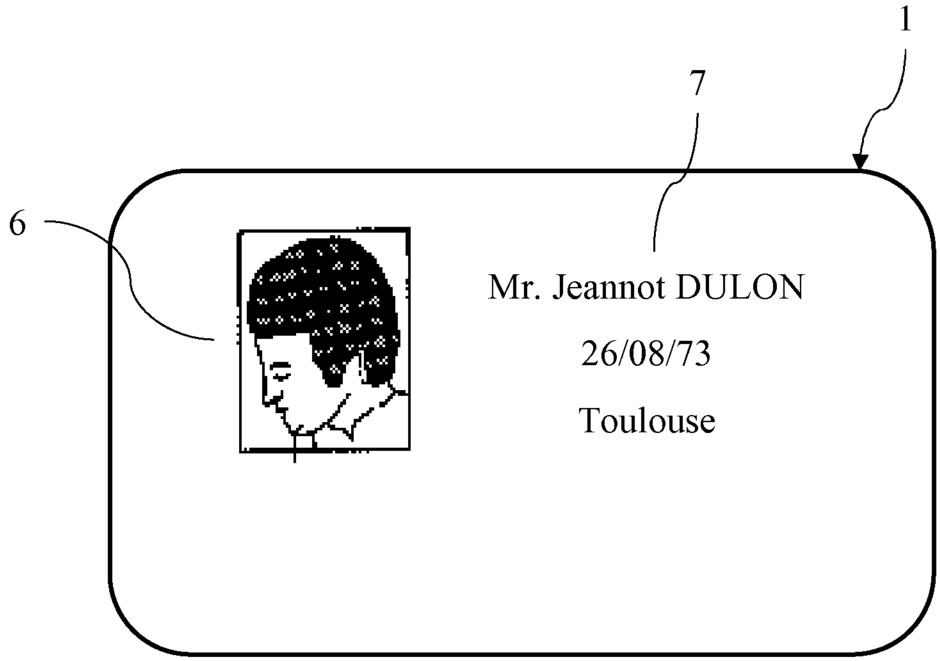

FIGS. 1 and 2 show a personalisable support 1, e.g. an identity card, including a body 2 equipped, on the upper side 3, with official personalisation data 4, 6, 7 relating to the holder of the card. This personalisation data is transferred by a graphic personalisation device, e.g. by a YAG laser. Card 1 includes a card body 2 made of opaque plastic material, e.g. polycarbonate, PET and/or ABS or PVC. A transparent protection layer 5, still called "overlay" in card jargon, is favourably fixed on at least one side of the card body. The card body 2 is to be equipped, on its upper side 3, with personalisation data 4. Generally and as an example the personalisation data 4 transferred to the card body 2 includes, according to FIG. 2, a photograph 6 of the card holder and alphanumeric characters 7 relating to holder's identity. The personalisation data 7 and the photograph 6 are for example registered on the surface 3 of the card body by using a laser beam that burns the surface of the card body. The resulting local colour fading of the surface depends on the available energy, on the duration of inscription and on the used material of the card body. In other realisation modes the personalisation can be made directly into the transparent protection layer 5. In this case the material used for transparent protection layer 5 is a material doped with carbon particles that blacken when exposed to a laser beam. In any case such a personalisation made on the surface of the card body or on the transparent protection layer will be called official personalisation in the following of the present document, in contrast to an unofficial or fraudulent personalisation that is made in order to falsify a document or to create a falsified document.

These personalised supports are used increasingly, e.g. for identity cards or passports. As they are intensively used and regarding the character of identity controls, they have to be designed to be protected against any attempt of violation or falsification with the highest possible degree of security.

In order to meet this demand it is possible to add curved lines, so-called guilloches, on the personalisation data after the inscription. However, even if the guilloches form more or less complex patterns they are still predictable and always transposable from one support to another. So, with a classic guilloches pattern it is possible to analyse the guilloches pattern of a support and to prepare a falsification of the personalisation data that avoids printing on the respective guilloches.

Another way of protecting personalised supports is to form anti-forgery devices by a subdivision of every pixel of a support's surface into a matrix of N points. The N points have different colour densities in order to obtain an average colour density of the matrix that is equivalent to a colour which is predetermined for the respective pixel. At least some of the N points of the matrix are pre-sensibilised for inducing a more or less fast darkening of the colour in case of an additional personalisation, in contrast to other points that have not been pre-sensibilised. Accordingly, if a fraud tries to modify a photo by adding an overload, the pre-sensibilised points of every matrix sustaining such an additional fraudulent personalisation will react more or less than the others and darken more or less quickly. Hence, every matrix or respective pixel will react differently according to the number of pre-sensibilised points per matrix and to the degree of pre-sensibilisation of these points and some pixels will appear darker or brighter than the nearby pixels. So, in the zones where an additional personalisation has been carried out, lines and/or texts and/or logos will appear in brighter of darker colourings in comparison to an average colour density. Fraudulent personalisation will immediately be visible to the naked eye. The realisation of such a solution is however quite long and complex and therefore relatively expensive.

Finally there are other techniques consisting of the creation of safe elements by producing micro-perforations in the support body; said micro-perforations reproduce the personalisation data, such as the holder's photograph for example, in order to validate the holder's photo. A laser technology is used to produce the micro-perforations through the width of the support body; the perforations are arranged in such a way they form an image that is visible to the naked eye when the document is lighted, enabling a simple verification. This technology however needs an additional step of reproduction of personalisation data that needs to be true to the original and therefore very precise, by using a perforation laser. The realisation of such a solution is however quite long and complex and therefore relatively expensive.

Furthermore the technical problem being the object of this invention consists of proposing a personalisable support including a body which is, on the one side, equipped with personalisation data, obtained by carbonisation of the base material by means of a laser beam and including a number of graphical anti-forgery devices covering all or part of said personalisation data, the said graphical anti-forgery devices being provided to indicate any fraudulent personalisation attempt of said support on the said corresponding locations allowing to quickly and simply indicate any fraudulent additional personalisation attempt and which also allows to diversify the anti-forgery devices for every support and finally which provides a serious and efficient alternative to the existing solutions that have already been proposed.

The solution for the posed technical problem is obtained according to this invention by the fact that the graphical anti-forgery devices draw a pattern and contain, along this pattern, bubbles whose density varies depending on the degree of carbonisation of the areas which are covered by this said pattern.

Thus, if a person carries out a fraudulent additional personalisation attempt, a carbonisation overload is created in certain locations. However, the density of the bubbles created within the process of securing the support does not change within those areas, so that the overall appearance of the image changes.

The invention also refers to a process of securing a personalisable support including a body which is, on one side, equipped with personalisation data, obtained by carbonisation of the base material by means of a laser beam, characterised in that it includes a number of graphical anti-forgery devices covering all or part of said personalisation data, involving a specific pattern, integrating along this pattern bubbles whose density varies with the carbonisation degree of the area covered by the image. Said graphical anti-forgery devices are provided to indicate any fraudulent personalisation attempt of said support on the said corresponding locations.

The invention also refers to the use of a $CO_2$ laser to secure personalisation data on a personalisable support. Said personalisation data is realised by carbonisation of the base material of said personalisable support by means of a YAG laser. This CO2 laser enables the generation of bubbles in the carbonised areas with the density of said bubbles varying according to the degree of carbonisation of the carbonised area in which they are created.

Figure 3:
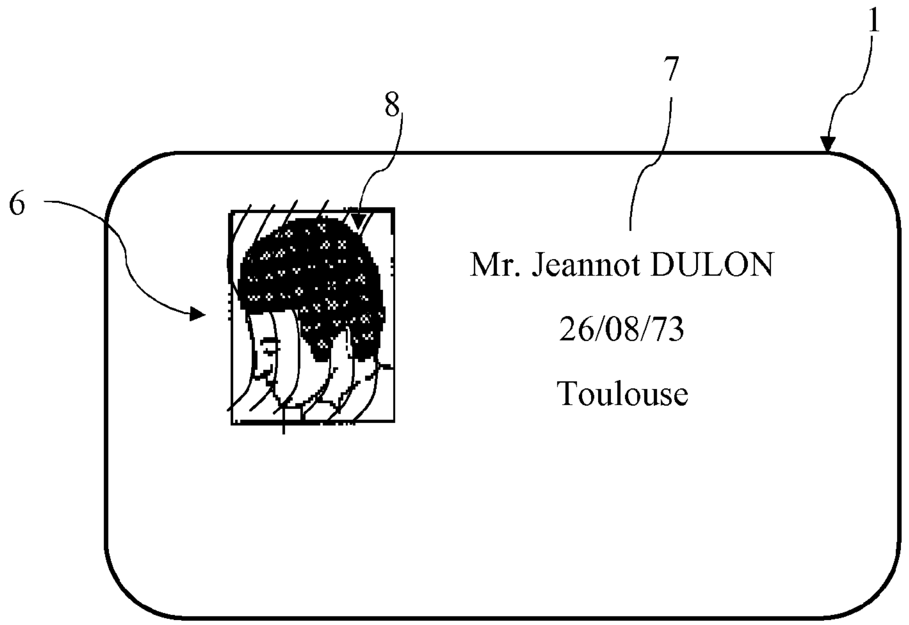
Figure 4:
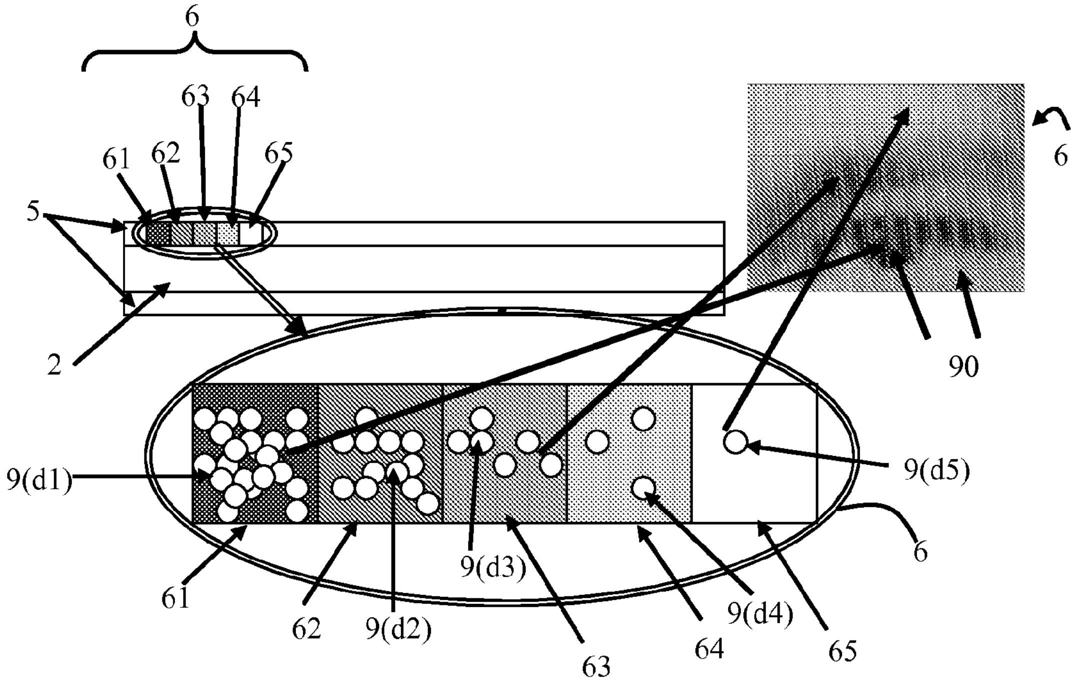
Figure 5:
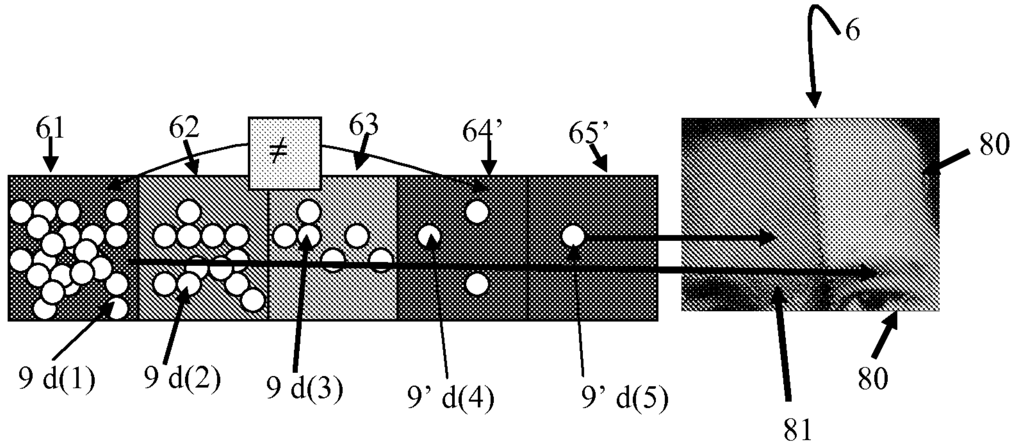

Other characteristics and advantages of the invention will become apparent thanks to the following description which is given by way of example but not limitation referring to the enclosed figures showing:

FIG. 1, which has already been described, a section drawing of a card type personalisable support comprising personalisation data, FIG. 2, which has already been described, a bottom view drawing of the personalisable support depicted in FIG. 1, FIG. 3, a top view drawing of a personalisable support according to the invention, FIG. 4, a section drawing of the personalised support depicted in FIG. 3 with a detail drawing of a photo and the anti-forgery devices obtained according to this invention, FIG. 5, a section drawing of the same support as depicted in FIG. 4 in case of an fraudulent additional personalisation attempt.

FIGS. 3 and 4 show a personalisable support according to the invention. On these figures the support is shown as a card. However, the support is not limited to this format and can have any other form such as a booklet format like a passport for example.

The shown support comprises a body 2 that is protected from environmental conditions on the two main sides by a transparent protection layer, which is generally known as "overlay" when referring to cards. This support comprises personalisation data in form of alphanumeric characters 7 of the holder's identity and/or in form of a photographic reproduction 6 of the support holder. In addition, anti-forgery devices 8 are provided at least in certain areas of the personalisation data such as the photo for example. These graphic anti-forgery devices 8 form a specific image 8 such as a guilloche pattern, for example. This pattern 8 can vary from one support to another or not.

According to a preferred realisation mode of the invention the personalisation data 6 is printed onto the overlay layer 5. For this purpose a laser ray sensitive overlay is used. This may be, for example, an overlay made of a carbon particle reinforced polymer. The polymer can be, for example, PVC or polycarbonate. For the realisation of the official personalisation, for example, a 1064 nm YAG laser can be used. During this process the carbon particles that are embedded in the interior of the overlay absorb the YAG laser energy and become black. The internal structure of the overlay is thus modified. According to the areas of the photo which is to be printed certain areas of the overlay are burnt more or less intensively and thus appear more or less black. These areas are shown in FIG. 4, with the references 61 to 65, where reference 61 shows a very black area and thus with a very elevated degree of carbonisation of the carbon particles per volume unit, reference 63 shows a grey area comprising less carbonised particles per volume unit than the area with reference 61 etc.

The following step of the production procedure of a secured personalisable support then consists in realising the graphic anti-forgery devices. For this purpose a $CO_2$ laser with a wavelength of, for example, 10640 nm is used. This laser can be used to draw a specific pattern and to generate bubbles along this pattern at the inside of the overlay. The higher the degree of carbonisation per volume unit in the overlay the more reactive this carbonised material is with regard to the $CO_2$ laser beam. The $CO_2$ laser causes the destruction of the material and thus enables the generation of bubbles inside of the overlay whose density varies according to the degree of carbonisation per volume unit of the overlay.

The bubbles which are created in this way may differ in their type. They can, for example, be filled with air, or they can also be filled with a gas resulting from the combustion of the material. Thus, they can, for example, be filled with a carbon gas which forms due to the presence of carbon particles in the overlay or a chlorine gas, for example, due to the combustion of PVC if this material is used for the production of the overlay.

FIG. 4 shows a detail drawing of these anti-forgery devices realised on the support which is thus officially personalised. The graphic anti-forgery devices form a pattern which is visible from the outside but which is not prejudicial to the perception of photo 6. This pattern, reference 90 on the detail drawing of a photo 6 which shows an eye on FIG. 4, shows, for example, a guilloche pattern. It is best realised using a $CO_2$ laser. Thus, bubbles can be created in the overlay. The density of the bubbles depends on the degree of carbonisation of the areas which are covered by this pattern. Thus, in the example shown in FIG. 4, the density d1 of the bubbles 9, generated in the strongly carbonised area 61 of the overlay, is much higher than the density d3 of the bubbles generated in area 63 which is still higher than density d5 of the bubbles generated in the very light area 65. The bubbles that are generated in this way thus form a visible pattern due to the modification of the internal structure of the overlay, are transparent and thus do not hinder the visual perception of the photo.

Moreover, the density of the bubbles depends also on the energy of the used $CO_2$ laser. It is important that this energy is well-controlled to ensure that the carbonised areas and the overlay are not destroyed completely and the perception of the photo is not affected. If the force of the used energy is too high, the destruction of the material might be too strong which might render the perception of the photo difficult or even impossible and thus destroy the overlay completely. If, on the contrary, the energy used is too low, the number of created bubbles would be insufficient to detect a forgery attempt. The energy of the CO2 laser must thus be controlled in such away that the desired effect is obtained. However, the energy also depends on the used laser and especially on its focal length, its marking speed, its frequency etc. As an example, a guilloche pattern comprising bubbles which were generated with a density depending on the degree of carbonisation of the covered areas was realised at the inside of an 150 μm thick overlay using a CO2 laser on a contrasted black and white image with a wattage of 20 W, a laser pulse frequency of 15 Khz and a marking speed of 1000 mm/s. Of course, these values are for your information only and a professional will be responsible for controlling the used laser in such a way as to obtain the desired optimum effects.

FIG. 5 shows the case where a fraudulent personalisation attempt of a photo protected by the anti-forgery devices described above is made. In this example the graphic anti-forgery devices do not form a guilloche pattern as in FIG. 4 but specific patterns 80 which are located at strategic locations of the photo, i.e. at vulnerable points that might be more easily modified. These points include for example the hair, the eyes, the mouth, the cheekbones etc. . . . In this case the fraudulent additional personalisation which was made by YAG laser like the official personalisation consists in adding a carbonisation overload, i.e. in blackening certain areas. Such a fraudulent personalisation allows the addition of black to a photo but it does not allow the addition of bubbles to the areas where the overload has been added. In the example of FIG. 5 the fraudulent personalisation consists, for example, in browning the complexion of the holder in the photo. As a consequence the original density d4, d5 of the bubbles 9' in the areas 64', 65' where an additional carbonisation has taken place remains the same and does no longer correspond to the degree of carbonisation. The overload is thus immediately visible to the naked eye because there are less bubbles in the added dark areas.

Another advantage of these bubbles is that in case of fraudulent personalisation, the bubbles let the whole or part of the YAG laser beam, which is used by the fraud, diverge or converge, depending on the place of the beam in relation to the bubbles, so that there forms a light circle which is brighter and/or darker around these bubbles and the anti-forgery pattern. The fraudulent additional personalisation therefore leaves more intensive and/or brighter traces and/or marks next to the security pattern, which appears as phantom image 81.

If the fraud then wants to reconstruct the pattern which was drawn by the anti-forgery devices, with the density of the bubbles corresponding with the degree of carbonisation of the forged areas, he has to determine the energy of the $CO_2$ laser which was used to create these bubbles. Obtaining the exact density of the bubbles is, however, very difficult, especially with a high degree of carbonisation because the more bubbles are created within the overlay the higher the risk of damaging the overlay. This would result in the overlay being completely removed from the body of the card.

Another advantage of these bubbles, which are created within the overlay, lies in the fact that they allow for creating areas with a higher or lower mechanical resistance, depending on their density, so that in case of an attempt to remove the overlay, the overlay tears along the patterns which were realised by means of the $CO_2$ laser and which contain a bigger or smaller number of bubbles.

Another advantage of this preferred mode of realising this invention according to which the official personalisation and the anti-forgery patterns are created within the overlay is that if a fraud manages to completely remove the overlay, he does not only have to reconstruct the personalisation by means of a YAG laser but must also dispose of a $CO_2$ laser for reconstructing the bubbles. By admitting that this is possible, one variant of the invention consists in extending the personalisation and the generation of bubbles to the surface 3 of the body 2 of the support. In this case, the surface of the body of the support is burned by the YAG laser in the moment of the official personalisation; then, at the moment of making the card secure, it is engraved more or less profoundly by means of the $CO_2$ laser, depending on the degree of carbonisation of the surface. Thus, the body 2 of the support and the overlay 5 are completely connected with each other and any attempt to remove the overlay will immediately be visible for the naked eye.

The density of the bubbles depends on the darkened areas; therefore, the densities of the bubbles along the graphical anti-forgery pattern vary from one support to the other, depending on the photo of the card holder. In addition, even if in the description the anti-forgery devices have been described for a photo only, they also apply to the alphanumeric characters.

The pattern which is drawn by the graphical anti-forgery devices can vary from one support to the other and the fraudulent personalisation is not detected from the geometry of the pattern but from the density of the bubbles which depend on the degree of carbonisation of the covered area.

The graphical anti-forgery devices, which have been described above, therefore constitute an official personalisation mark, a mark which cannot be modified in the case of additional fraudulent personalisation.

The invention claimed is:

1. A personalisable support comprising:

a body (2) which is on one side equipped with personalisation data (6,7) in the form of a carbonized base material and which contains graphical anti-forgery devices (8), covering the whole or part of these personalisation data (6,7), with these graphical anti-forgery devices being provided in order to indicate every attempt of fraudulent personalisation of this support at the corresponding places, wherein the graphical anti-forgery devices comprises a pattern (90,80) containing bubbles (9) wherein the density of bubbles varies depending on the degree of carbonisation of the personalisation (6) data areas (61-65) which are covered by this said pattern.

2. The personalisable support according to claim 1, wherein the graphical anti-forgery devices (8,81,80) are located within a transparent protection layer (5) which is reactive to the laser beam.

3. The personalisable support according to one of the claims above, wherein the graphical anti-forgery devices are obtained by means of a $CO_2$ laser beam.

4. The personalisable support according to one of claims 1 to 2, wherein the graphical anti-forgery devices comprises a visible pattern.

5. A process for securing a personalisable support consisting of a body (2) which is, on one side, equipped with personalisation data (6,7), comprising:

carbonising the base material by means of a laser beam, realising the graphical anti-forgery devices (8), by covering all or part of said personalisation data (6,7), according to a pattern (90,80) integrating along this pattern bubbles (9) whose density (d1-d5) varies with the carbonisation degree of the area (61-65) covered by the pattern wherein the graphical anti-forgery devices are provided to indicate any fraudulent personalisation attempt of said support on the said corresponding locations.

6. The process according to claim 5, wherein the graphical anti-forgery devices are obtained by means of a $CO_2$ laser beam.

7. A method to secure personalisation data (6,7) on a personalisable support (1), comprising: carbonising the base material of said personalisable support by means of a YAG laser; and using a $CO_2$ laser to cause the formation of bubbles (9) in the carbonised areas (61-65) with the density (d1-d5) of said bubbles varying according to the degree of carbonisation of the carbonised areas (61-65) in which they are created.

8. The personalisable support according to claim 3, wherein the graphical anti-forgery devices comprises a visible pattern.

* * * * *